US007141350B2

(12) United States Patent
Hall

(10) Patent No.: US 7,141,350 B2
(45) Date of Patent: Nov. 28, 2006

(54) ARTICLE OF MANUFACTURE HAVING A PERFORMANCE VERIFICATION INDICATOR

(75) Inventor: Jeffrey L. Hall, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 65 days.

(21) Appl. No.: 10/667,796

(22) Filed: Sep. 22, 2003

(65) Prior Publication Data

US 2005/0064323 A1 Mar. 24, 2005

(51) Int. Cl.
*G03F 7/004* (2006.01)

(52) U.S. Cl. .................. 430/270.1; 396/284; 116/216; 428/40.1; 252/408.1

(58) Field of Classification Search ............ 430/270.1; 396/284; 116/216; 428/40.1; 252/408.1
See application file for complete search history.

(56) References Cited

U.S. PATENT DOCUMENTS

| | | | | |
|---|---|---|---|---|
| 3,999,946 | A | 12/1976 | Patel et al. | |
| 4,057,029 | A | 11/1977 | Seiter | |
| 4,432,656 | A | 2/1984 | Allmendinger | |
| 5,940,637 | A | 8/1999 | Manico et al. | |
| 6,043,021 | A | 3/2000 | Manico et al. | |
| 6,103,351 | A | 8/2000 | Ram et al. | |
| 6,113,857 | A | 9/2000 | Manico et al. | |
| 6,382,125 | B1 * | 5/2002 | Tamura | 116/207 |
| 6,536,370 | B1 * | 3/2003 | Paton et al. | 116/206 |
| 6,629,057 | B1 * | 9/2003 | Zweig et al. | 702/182 |
| 6,630,278 | B1 * | 10/2003 | Van den Zegel et al. | 430/139 |
| 6,756,591 | B1 * | 6/2004 | Lounis et al. | 250/316.1 |
| 6,757,492 | B1 * | 6/2004 | Hall | 396/284 |
| 6,786,638 | B1 * | 9/2004 | Bonds et al. | 374/162 |
| 6,801,477 | B1 * | 10/2004 | Braunberger | 368/327 |
| 6,938,004 | B1 | 8/2005 | McIntyre | |

FOREIGN PATENT DOCUMENTS

| | | |
|---|---|---|
| EP | 0 484 578 A1 | 5/1992 |
| EP | 1 146 457 A2 | 10/2001 |
| EP | 1 225 475 A1 | 7/2002 |

OTHER PUBLICATIONS

U.S. Appl. No. 09/766,917, filed Jan. 22, 2001, David E. Fenton.
Lynn I. Gibbs, MPH, et al."Heat Exposure In An Enclosed Automobile" J La State Med Soc, vol. 147, Dec. 1995, p. 545-546.

* cited by examiner

*Primary Examiner*—Amanda Walke
(74) *Attorney, Agent, or Firm*—Clyde E. Bailey, Sr.; Paul A. Leipold

(57) ABSTRACT

An article of manufacture has an environmental sensitive label with at least one cumulative time-temperature indicator and at least one thermal event indicator thereon. The cumulative time-temperature indicator and the thermal event indicator each provides an independent verification of product performance in a predetermined environment.

20 Claims, 8 Drawing Sheets

ARTICLE OF MANUFACTURE HAVING A PERFORMANCE VERIFICATION INDICATOR

CROSS-REFERENCE TO RELATED APPLICATIONS

The present application is related to U.S. application Ser. No. 10/667,915 filed herewith, by Jeffrey L. Hall, and entitled, "Method Of Verifying The Usability Of Photosensitive Film Product Just Prior To Use."

FIELD OF THE INVENTION

The invention relates generally to the field of product performance verification. More specifically, the invention concerns an article of manufacture and method having elements for verifying product performance just prior to use.

BACKGROUND OF THE INVENTION

Consumers use a variety of means to record images including film based still cameras, digital-based still cameras, and video, to name a few. Film based systems rely on silver halide to record the scene as a latent image that is then manipulated, usually through a processing step, to create a film image of higher, visual density. The film image can be viewed directly as in reversal photography, or it can be scanned and printed as in an all-optical system for color negative photography, or it can be scanned and digitized as in a digital system regardless whether it is reversal or color negative photography. The digitized image can be printed, stored, and/or electronically distributed. All of these image-recording systems have sensitivity to the ambient conditions under which the taking device, the prints, or the electronic data itself are stored.

Consumer research has shown that for film based systems, consumers want assurances that the film is not damaged by temperature and/or weather before the film is used. They worry that the conditions of use such as the camera sitting in too hot an environment, might damage the film. Some consumers are aware that such stressful conditions have ruined pictures that they have taken. Others believe that heat or weather damage was responsible for poor pictures taken, for example, during trips to the beach or while on a vacation when the pictures turn out to have lower quality than expected. Consumers want a system that takes the worry out of their picture-taking activity.

Unfortunately, satisfying this consumer desire poses a dilemma. Unprocessed silver halide based products are chemical based systems that degrade over time. The rate of degradation is dependent on temperature, relative humidity, and background radiation. The extent of this degradation is dependent on the time of exposure to these environmental conditions. Additionally, the extent of the degradation can be modified by the aggregate exposure of the film to these degrading ambient conditions. For example, exposure to a radiation source like that used to x-ray airline packages can generate metallic silver centers that themselves act to accelerate natural age degradation of the film. Alternatively, silver halide-based systems thermally shocked by exposure to high temperature such as in the glove box of a car have accelerated degradation processes at these high temperatures than if the system were always stored at 70° F.

The silver halide based product manufacturer can use product design and product packaging to help manage this inherent system instability, but not eliminate it. They can control temperature, humidity and storage location to manage background radiation effects in order to slow the rates of these degradation processes to some extent. Additionally, they can control inventory within their distribution channels to increase a product's turnover per year in order to reduce the age of the product in the supply chain before a consumer purchases the product. However, they make no attempt except for expiration dating at controlling the film inventory of a consumer.

Silver halide based product manufacturers can add expiration dating to the package to encourage the consumer to use the film within a specified period of time. However, silver halide based systems exposed to high temperature conditions associated with storage of, for example, a loaded camera or roll of film in the glove box of an automobile, can degrade considerably faster than predicted by the expiration dating on the box. That is, the expiration dating is a guide to the quality of the film under less stressful storage conditions. Once the product is in the consumers' hands, particularly when the product is loaded in a camera for film based systems, such managed control of temperature, relative humidity, and background radiation exposure is generally lacking. In addition, the time the product is used by the consumer varies widely, thus leading to product utilization that is well beyond the optimum performance capability of the product. In addition to providing a means of assurance to the consumer that the product is good, it would be desirable to increase the rate at which product held by the consumer is used so that the product is used nearer its peak performance.

Consumers can purchase film as single rolls or in multi-pack blocks of films. The former are often available in retail stores while large multi-pack block sales are often associated with discount warehouses. The trade recognizes that individual consumers have an average rate at which they use film. Therefore, the time between film purchases is longer when film is purchased in a large block. Since the film within such a large block is most frequently from the same time of manufacture, then, until this film is fully consumed, it will be aging while in the hands of the consumer. That is, there is a film age distribution curve 5 in FIG. 1, which occurs in the marketplace because of the purchase and usage patterns of the consumers. The x-axis in this plot is the age of the film and the y-axis is the frequency that a film of age "X" months is observed in the trade.

Temperature, relative humidity and background radiation, all factors that can impact the quality of recorded images, are often closely controlled from the time of manufacture through the distribution chain. However, they are not controlled after the consumer purchases the film. Manufacturers attempt to address this issue by providing expiration dating 10 as shown in FIG. 1. This is the date that the manufacturer uses to set an upper limit to the film's lifetime in the trade. Consumers implicitly assume the film is good until then. However, expiration dating is only a general guide. It does not take into account how the consumer in fact handled the film during this time of storage and usage. In fact, film can be very rapidly degraded if the film is treated to severely high temperatures. Such might occur for a film or a loaded camera left in a closed automobile. Gibbs, et al. report that temperatures within an enclosed automobile can reach 120° F. within 10 minutes and 140° F. within 40 minutes when the ambient temperature is 93° F. (J. La. State Med. Soc., Vol. 147, December 1995, pages 545–546). It is common for consumers to have their film or loaded cameras in the car, thus subjecting the film to thermal events that are not part of the average treatment conditions anticipated by film manufacturers when they expiration date the film.

Given that the film degrades over time, there is an optimum range of age wherein the film is at peak capability, say over the time depicted by 20 in FIG. 1. Film that is older begins losing this peak performance. Film used past the manufacturer's expiration date may still provide pictorial results, but the resultant images are not as good as those that could have been obtained earlier in the film's life. This is to be expected. If it were different, then manufacturers would extend the expiration dates to a longer time. Expiration dating is an inefficient method to assure the consumer that the film they have purchased is still good.

Therefore, there persists a need in the art to develop an article of manufacture that enables consumers of fungible products, such as photographic film, to verify that the film product is still good for quality picture taking based on the consumer's storage and usage of the film.

SUMMARY OF THE INVENTION

The present invention is directed to overcoming one or more of the problems set forth above. Briefly summarized, according to one aspect of the present invention, an article of manufacture has an environmental sensitive label associated therewith. The environmental sensitive label has at least one cumulative time-temperature indicator and at least one thermal event indicator affixed thereto. Cumulative time-temperature indicator and at least one thermal event indicator each provides an independent verification of product performance in a predetermined environment.

The present invention has numerous advantages over prior art developments. First, the method of the invention enables the user of photosensitive film product to determine product performance in predetermined environment. Further, the method uses independent indicators of product performance affixed to the product or packaging to assist the user in verifying product performance. Moreover, the method of the invention is relatively simple to employ.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 2:
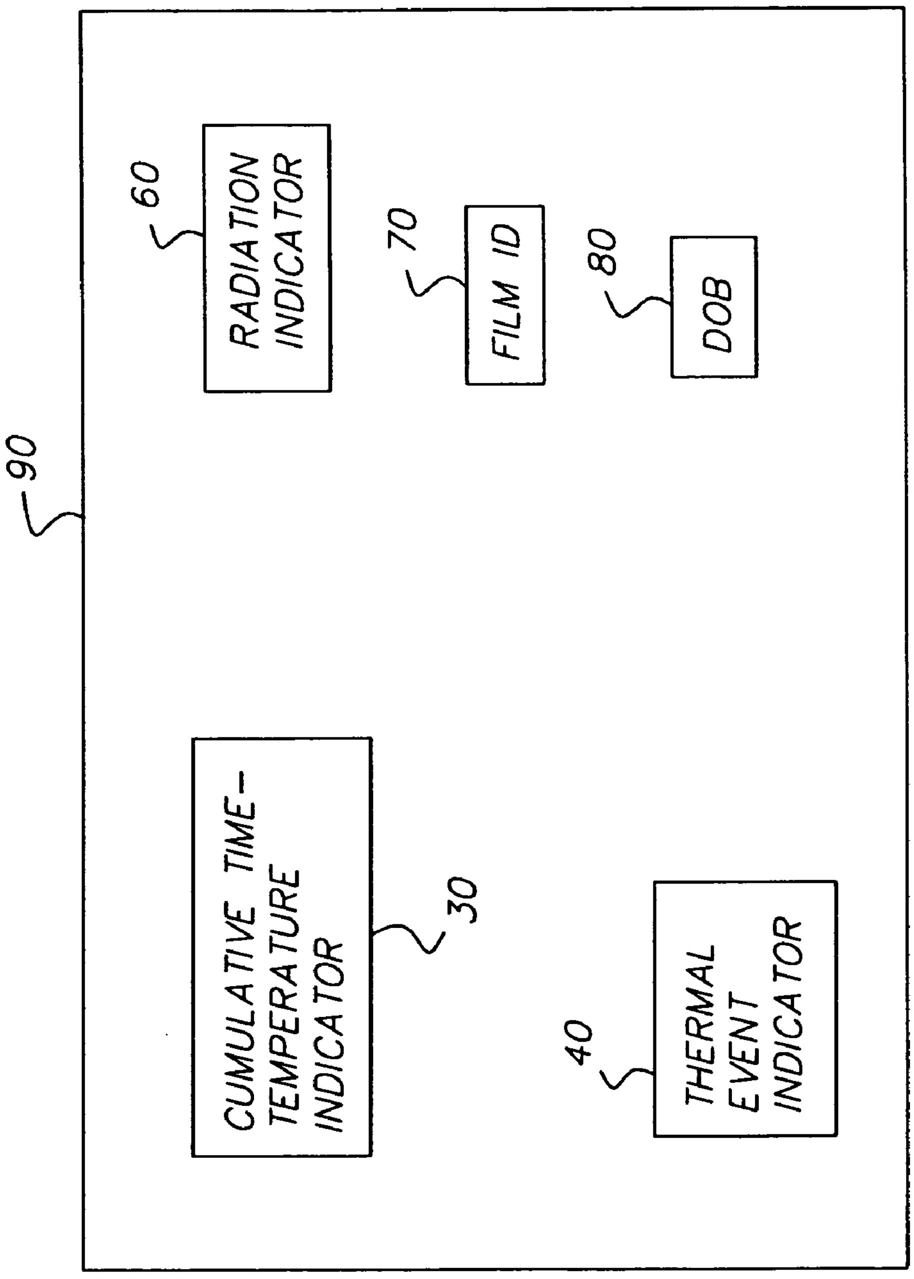
FIG. 2 is a schematic of an exemplary environmental sensitive removable label of the invention.

Turning now to the drawings, and particularly to FIG. 2, an environmental sensitive label 90 depicts the method of the invention. In the marketing of photographic products, such as photosensitive film products, there is a need for a method of enabling consumers to verify that the film product is still good for quality picture taking. According to the invention, one novel and unobvious method broadly includes providing, for the benefit of the consumer, a combination of indicator labels 30, 40, 60, freshness date indicator 80, and credits for unused film. The inventor believes that these provisions provide consumers assurances that the film in their cameras is good and to increase the rate at which the consumer uses the silver halide based product and thereby utilize the product at or near its performance peak. More particularly, the method of the invention, as illustrated by environmental sensitive label 90, includes the steps of: using indicator labels 30, 40, 60 (described in details below) to monitor the thermal and radiation environment in which the consumer uses the film; changing the method of dating the silver halide based product, such as freshness date indicator 80; and providing partial credit for unused images that remain on a roll of film.

Figure 8:
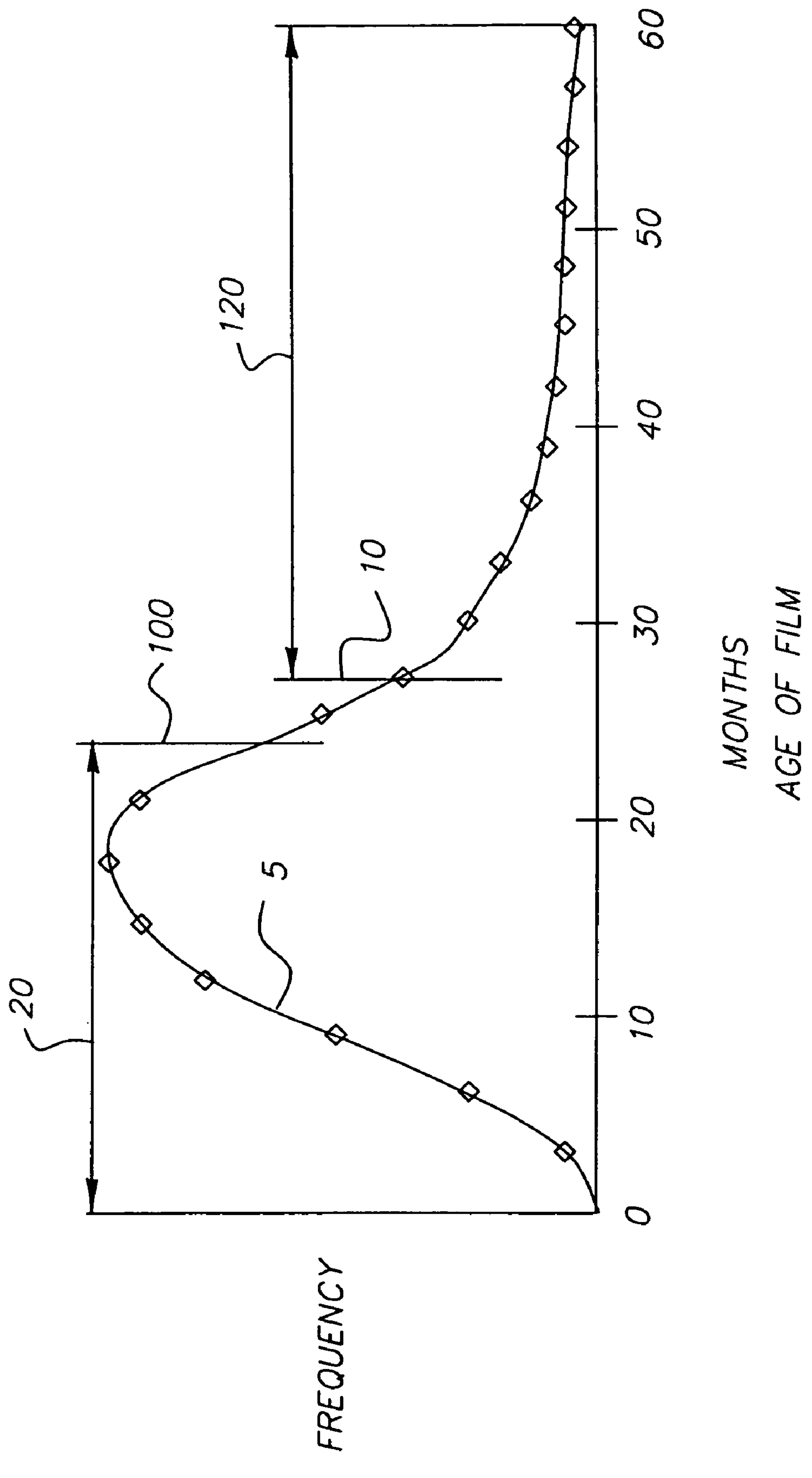

Referring to FIG. 2, an exemplary environmental sensitive label 90 of the invention is illustrated. Environmental sensitive label 90 contains several indicator labels 30, 40, 60 that are themselves used by the consumer to provide assurances that the film or the film in the camera is good. Preferably these indicator labels 30, 40, 60 would be used on an environmental sensitive label 90, such as the one contemplated by the invention, that can be removed from an outer container used to package the film and then applied to the camera when the film is loaded into the camera. Such a process is disclosed, for instance, in U.S. Pat. No. 6,043,021 issued Mar. 28, 2000 to Manico et al, titled "Packaged Photographic Product Containing Time And Temperature Integrating Indicator Device, And Process For Monitoring Thermal Exposure Of Photographic Material," hereby incorporated herein by reference. In so doing, the consumer can keep track of the film while the film is used in the camera. One such indicator is a cumulative time-temperature indicator 30 attached to removable environmental sensitive label 90. Cumulative time-temperature indicator 30 integrates the time-temperature profile of the film under expected ambient storage conditions. The rate of change of cumulative time-temperature indicator 30 is such that it signals at some time 100 (as shown in FIG. 8) that the film has reached its prime and will start to degrade. In U.S. Pat. No. 6,113,857 issued Sep. 5, 2000 to Manico et al., titled "Gauge Type Time And Temperature Integrating Indicator Device," hereby incorporated herein by reference, describes a time and temperature integrating device for providing a visually observable indication of cumulative thermal exposure. The device in the '857 Patent includes (a) at least two thermally sensitive image-forming areas of different thermal sensitivity; and (b) indicating indicia in association with the thermally sensitive areas for indicating when each thermally sensitive area of the device has been exposed to predetermined cumulative thermal exposures. (See also U.S. Pat. No. 6,103,351 issued Aug. 15, 2000 to Ram et al., titled "Time And Temperature Integrating Indicator Device;" U.S. Pat. No. 6,043,021, referenced above; and U.S. Pat. No. 5,940,637 issued Aug. 17, 1999 to Manico et al., titled "Photographic Film Cartridge Containing Time And Temperature Integrating Indicator Device, And Process For Controlling Photofinishing Of Film.")

Still referring to FIG. 2, the cumulative time-temperature indicator 30 can be any of a number of materials including those described in U.S. Pat. No. 3,999,946 in addition to the already cited references. The material selection is based on the best correspondence of the indicator material used to show the cumulative effect of time and temperature with the underlying performance attributed to the silver halide film. The rate of this cumulative time and temperature reaction has to be balanced for room temperature keeping conditions. That is, cumulative time-temperature indicator 30 is not a thermal event indicator because it does not respond rapidly to temperature spikes.

According to FIG. 2, the present invention as illustrated by removable environmental sensitive label 90, uses a thermal event indicator 40 in addition to a cumulative time-temperature indicator 30, unlike the prior art developments. A thermal event indicator 40 is attached to removable environmental sensitive label 90 to provide faster feedback to the consumer that the film or the film in the camera is exposed to very high temperatures. For this thermal event indicator 40, the response time to the temperature event should be rapid. A typical thermal event indicator 40 of the invention is one manufactured by the Paper Thermometer Company located in Greenfield, N.H. The thermal event indicator is used to quickly indicate when the product's temperature has exceeded certain thermal limits that are themselves specified by virtue of the underlying performance of the silver halide film. The thermal event indicator 40 should change quickly so that the consumer is aware of the severe ambient condition the film is experiencing and can thus take appropriate corrective action.

Figure 3:
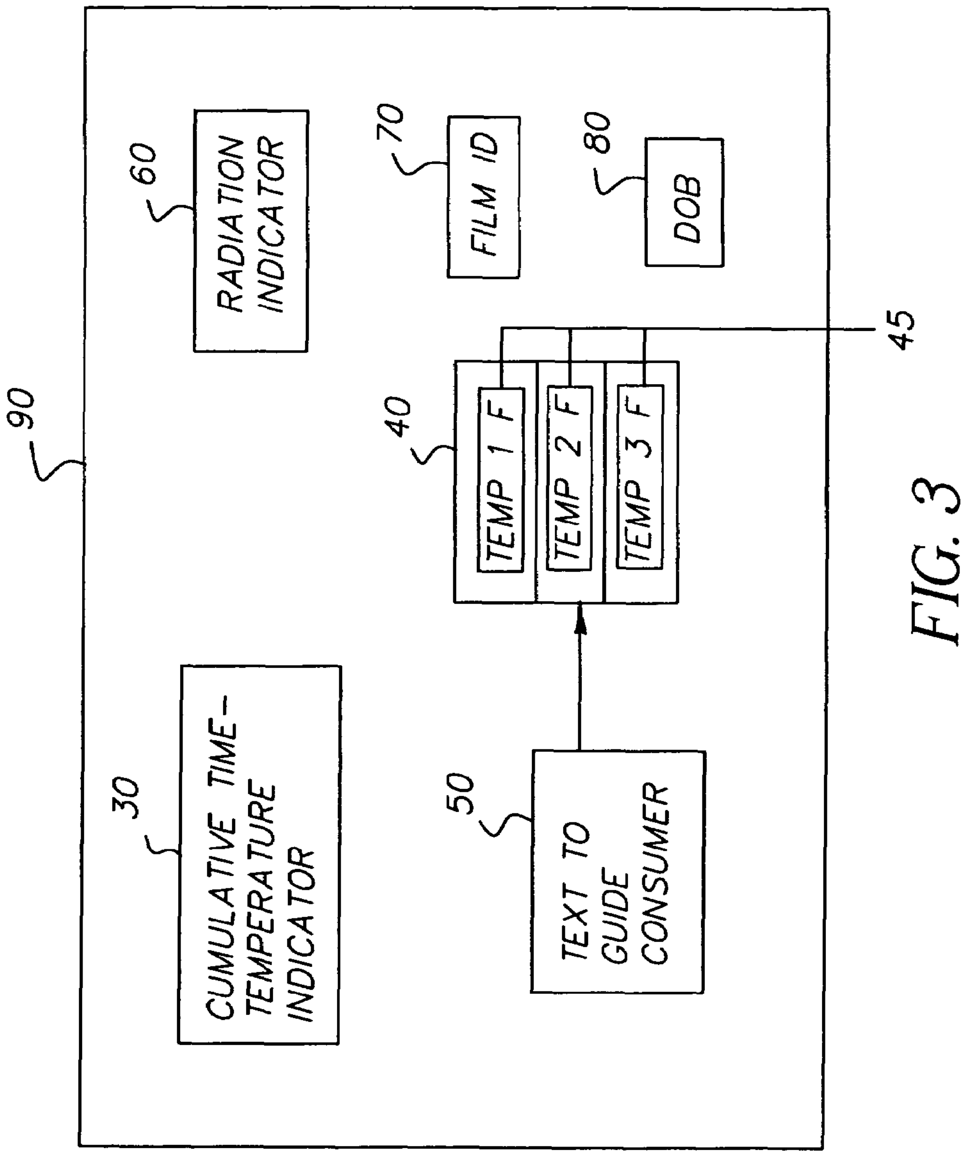
FIG. 3 is a schematic of another exemplary environmental sensitive removable label of the invention illustrating a three-temperature thermal event indicator and explanatory text for the consumer.

Referring to FIG. 3, the extent of failure for silver halide films increases with temperature until catastrophic failure occurs such as might occur when the film can no longer be used to record actinic radiation exposures. According to FIG. 3, therefore, thermal event indicator 40 could include a plurality of temperature indicators 45 to aid the consumer in assessing the thermal damage to the film.

Thermal event indicator 40 should not reversibly change with temperature. For instance, if film is moved from a hot environment that met or exceeded the threshold exposure temperature of the film and the thermal event indicator 40 changed in density, the thermal event indicator 40 should record and retain that temperature. The cumulative time-temperature indicator 30 helps the consumer appraise the longevity of the film's peak performance when the film has not been exposed to aggressive thermal environments. The thermal event indicator 40, on the other hand, helps the consumer appraise the continued utility of the film when thermal exposure of the film to abusive temperature conditions as might occur when the film is stored in an automobile has occurred.

Figure 4:
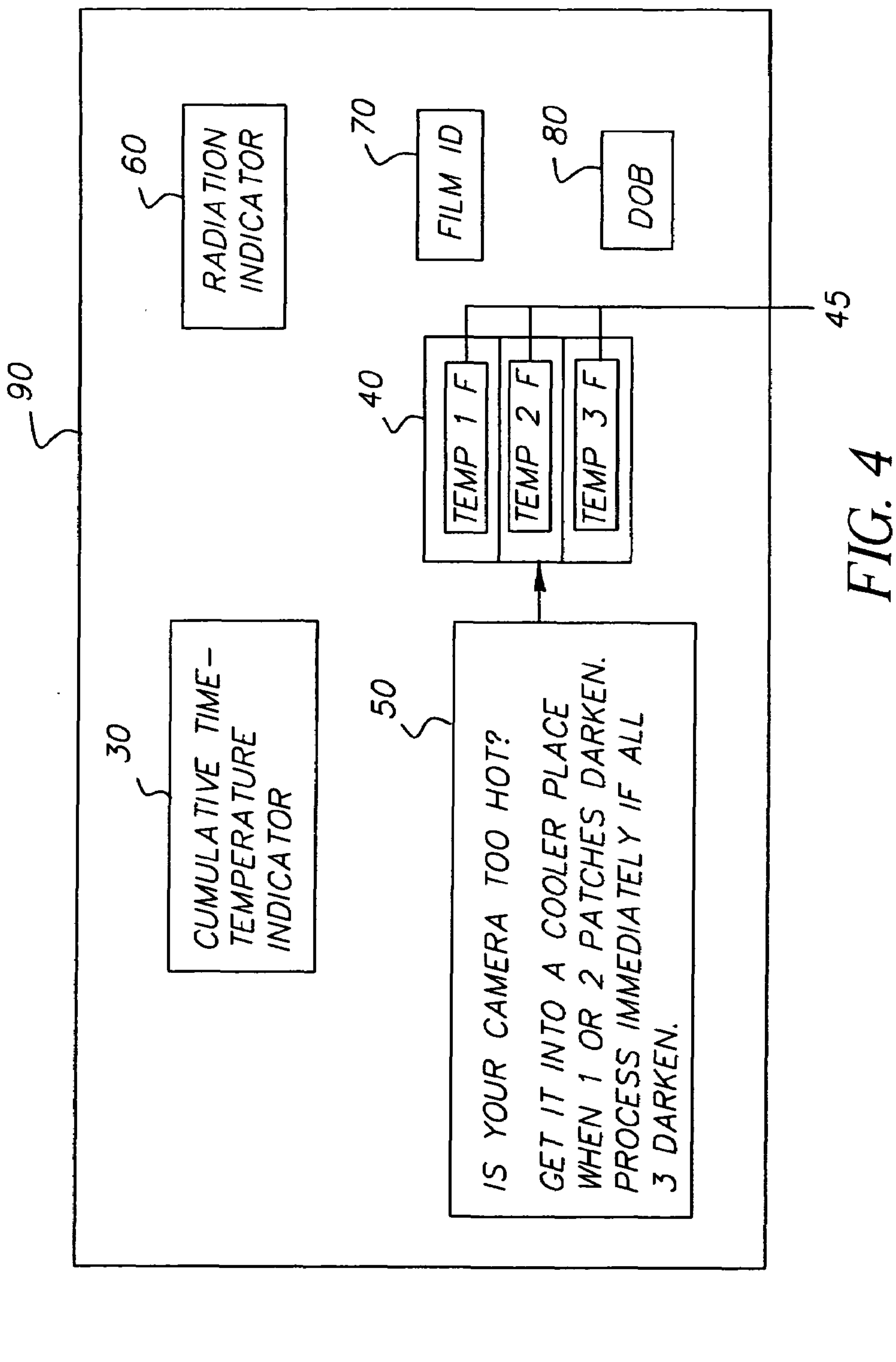
FIG. 4 is a schematic of still another exemplary environmental sensitive removable label of the invention illustrating a three-temperature thermal event indicator, explanatory text for the consumer, and an example of the text is indicated.

Referring to FIGS. 3 and 4, there is an additional need to include instructions to aid the consumer in the use of indicators 30, 40, 60 so that the consumer correctly interprets the desired assurance of film quality. This can be done through advertising, through instruction set 50 embedded within the packaging, or, preferably, with instructions on the removable environmental sensitive label 90. According to FIG. 4, an example of a preferred instruction set 50 is illustrated with respect to thermal event indicator 40. In this example, there are three temperature indicators 45 for the thermal event indicator 40 wherein Temp 1 is less than Temp 2, Temp 2 is less than Temp 3. Further, assume that Temp 1 is some high temperature that the film could endure for many hours without compromising performance. Temp 3 is an upper threshold temperature beyond which the film is considered to be at a thermal limit for its performance and only can be exposed to this temperature for some limited period of time that is less than that for Temp 1 exposure. The instruction set 50 would then alert the consumer that the film or film-loaded camera should be removed from this high temperature environment and cooled down if Temp 1, or Temp 1 and Temp 2 indicators have changed. A manifestation of this consumer alert according to the invention may include a darkening of the indicator label 40, as suggested by the instruction set 50 in FIGS. 4–6. Another manifestation within the contemplation of the invention is a consumer alert that includes a color change (not illustrated) of the indicator label 40. If each of the three temperature indicators 45 have changed, for instance has darkened, then the film should be immediately processed.

Referring again to FIG. 5, the temperatures at which the film is exposed could be indicated on the thermal event indicator 40 as illustrated by temperature indicators 45 having, for example, a Temp 1 of 140 F, a Temp 2 of 150 F, and a Temp 3 of 160 F. Alternatively, in place of these threshold temperatures (Temp 1, Temp 2 and Temp 3), the thermal event indicator 40 could contain indicia that specified the action the consumer should take. The resultant action by the consumer could be specified by the color or density change making visible the instructions to the consumer when the threshold temperature is reached. For example, Temp 1 and Temp 2 temperature indicators 45 could reveal the instruction "Remove to a Cool Place" when their respective threshold temperatures are reached. When Temp 3 threshold temperature is reached the revealed instruction could be "Process Immediately." Color could be used to highlight the immediacy of the action. For example, temperature indicators 45 (e.g. Temp 1, Temp 2, and Temp 3), could themselves be colored light green, light yellow, and red, respectively, to follow the universal color code that green is okay, yellow is caution, and red is stop. The instructions are then revealed in black lettering when the threshold Temp 1, 2, or 3 is reached. Alternatively, the color or density change could opacify an instruction. For example, any one of the temperature indicators 45 could be printed with "OK to Use" for Temp 1, Temp 2, and Temp 3. When the temperature indicators 45 reach their threshold temperature, the area darkens and the "OK to Use" disappears. It is clearly within the contemplation of this invention to use any combination of these instruction methods. For example, the opacification of the "OK to Use" for Temp 1 and Temp 2 can be coupled with a red-colored event indicator for Temp 3 that contains no indicia until its threshold temperature is reached and then Temp 3 displays "Process Immediately."

Referring again to FIG. 5, indicia are not limited to the thermal event indicator 40 but can also be used for the cumulative time-temperature indicator 30. In this example, a calibration ruler 35 is used to compare the indicia density to cumulative time-temperature indicator 30. The calibration ruler 35 illustrated in FIG. 5 uses, for example, multiple indicia 135, 136, 137, 138, and 139 to show the months remaining for acceptable film performance. For example, assume that the cumulative time-temperature indicator 30 matched the density of the middle step 137. In this case, the consumer knows that, if the film is kept at temperatures below the thermal event indicator thresholds of indicator 40, the film has 12 more months of useful life. As with the temperature indicators 45 of thermal event indicator 40, the indicia 135, 136, 137, 138, and 139 for the cumulative time-temperature indicator 30 could be part of the indicator itself.

Figure 5:
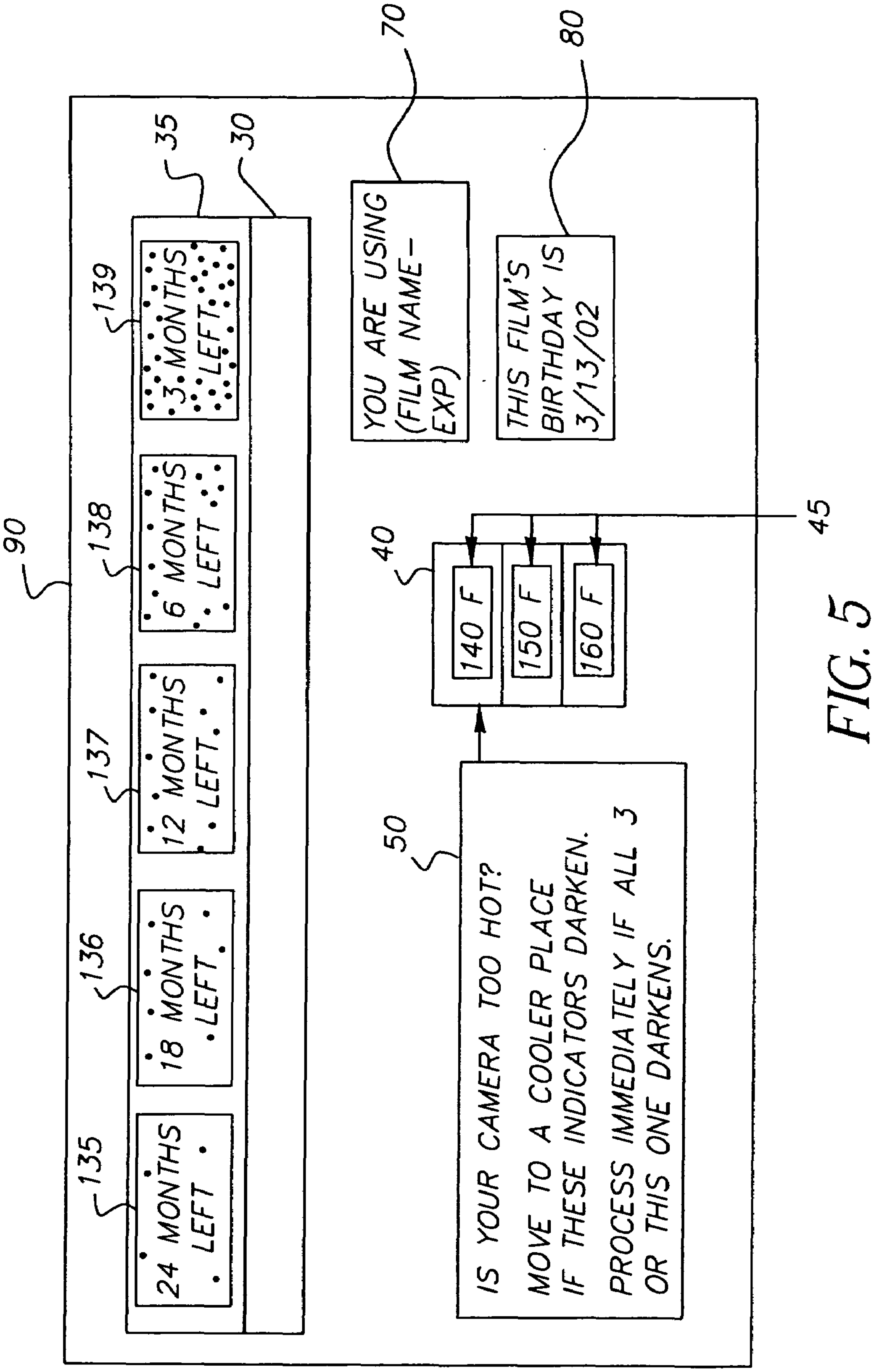
FIG. 5 is a schematic of yet another exemplary environmental sensitive removable label of the invention.
Figure 6:
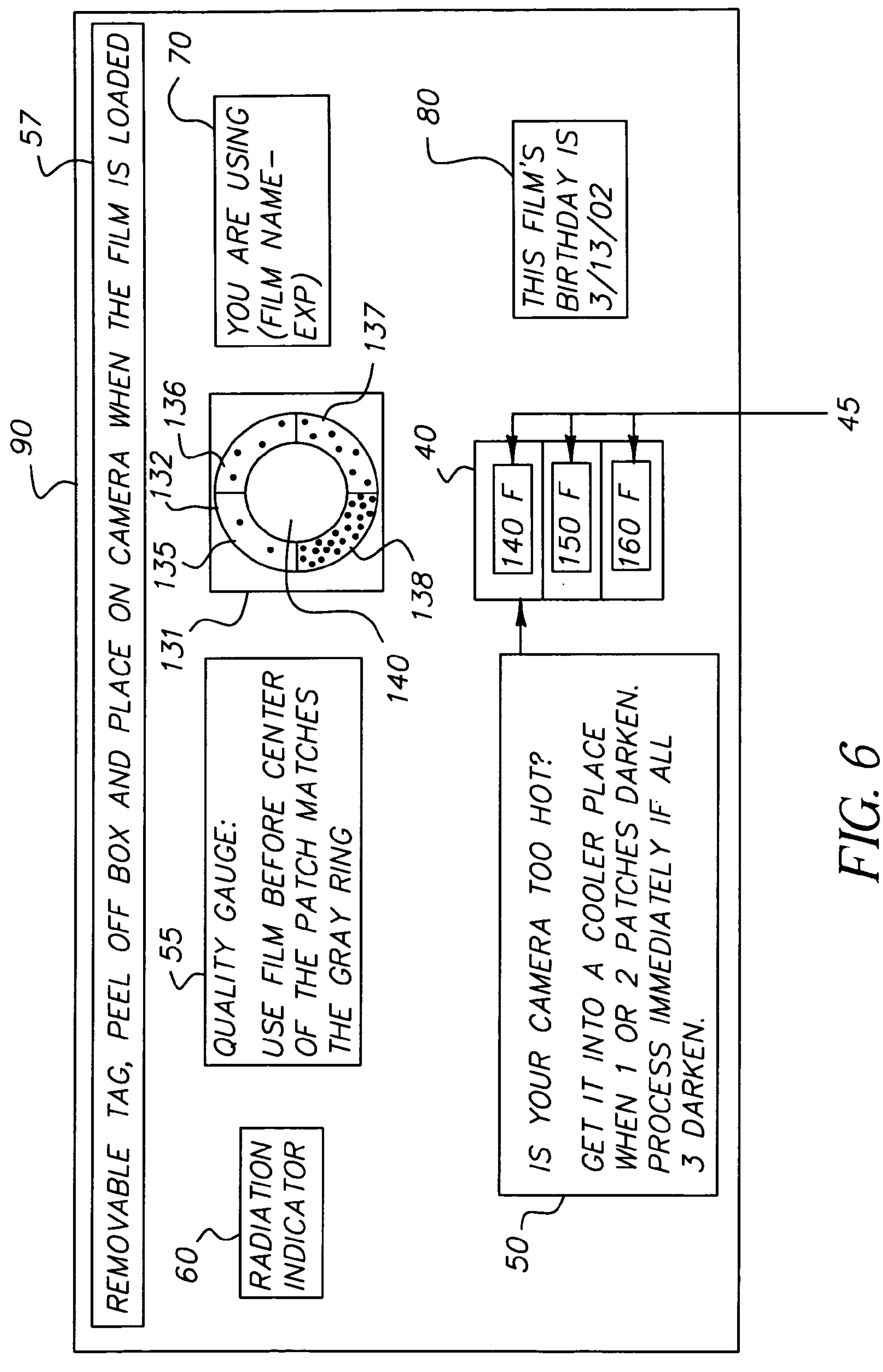
FIG. 6 is a schematic of still another exemplary environmental sensitive removable label of the invention.

Referring to FIG. 6. a bull's eye cumulative time-temperature indicator 131 is also within the contemplation of the invention. According to FIG. 6, bull's eye cumulative time-temperature indicator 131 may have multiple indicia 135, 136, 137, 138 to show the period remaining for acceptable film performance. Here the optional instruction set 55 instructs the user to use the film before the visual density of the inner circle 140 matches the visual density of one of the indicia 135, 136, 137, 138 in the annular ring 132. Indicia 135, 136, 137, 138 of annular ring 132 may include the time remaining as shown in FIG. 5.

Figure 7:
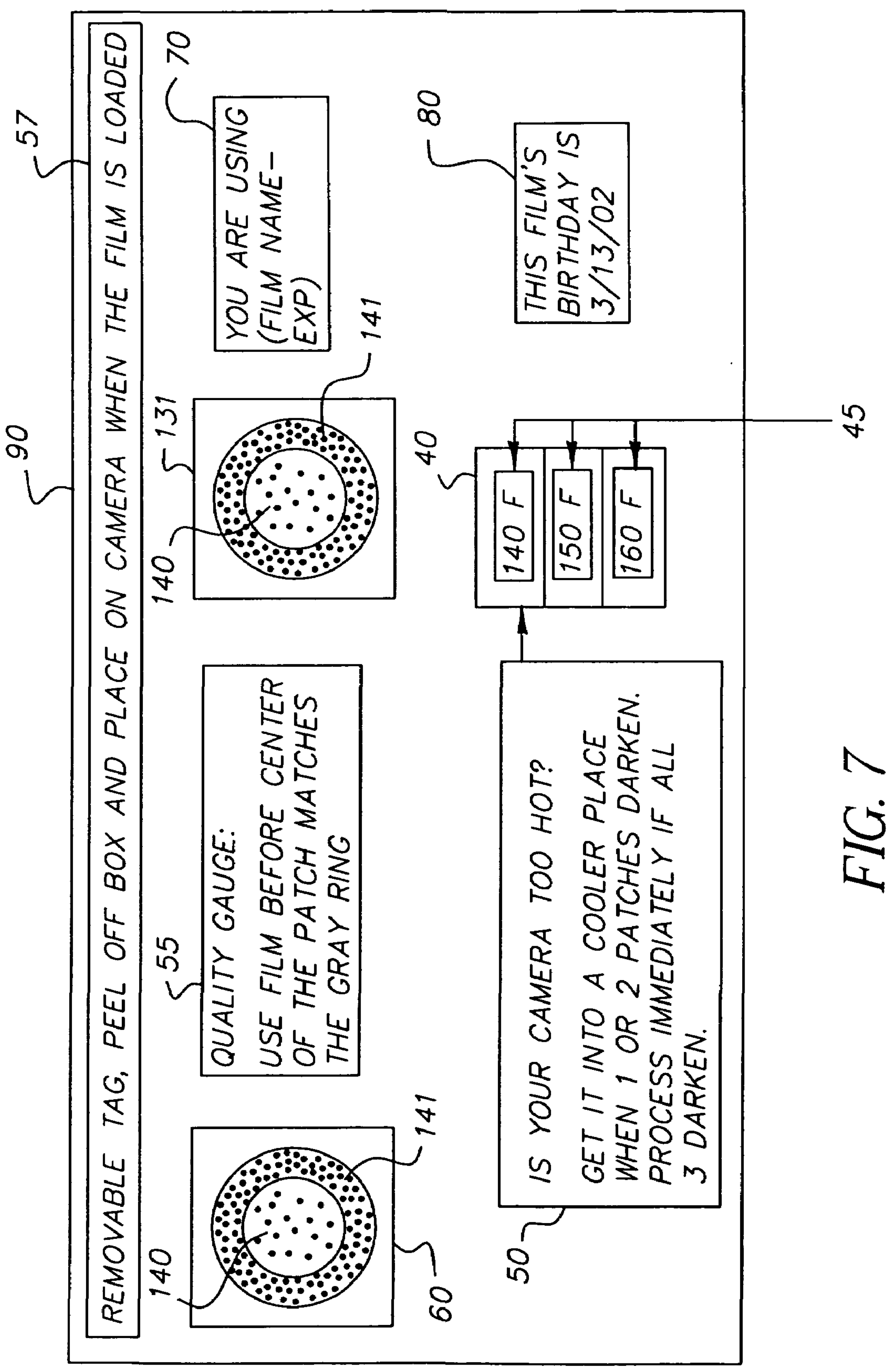
FIG. 7 is a schematic of another exemplary environmental sensitive removable label of the invention; and, FIG. 8 is an illustration of an age distribution curve for film received by a photofinisher for processing and illustrates how the components of this invention manage consumer inventory.

Referring to FIG. 7, an alternative to the multiple indicia 135, 136, 137, 138 in bull's eye cumulative time-temperature indicator 131 (FIG. 6), it is further within the contemplation of the invention to use a single annular ring 141. Here the optional instruction set 55 instructs the user to use the film before the density of the inner circle 140 matches the density of the annular ring 141. For example, rather than indicate the number of months that remain for optimal film usage as in cumulative time-temperature indicator 35 of FIG. 5, the bull's eye cumulative time-temperature indicator 131 simply indicates that the film should be used before the density of the inner circle 140 matches the density of the annular ring 141.

Skilled artisans will appreciate that another uncontrolled exposure that can degrade silver halide film's performance is the exposure to background radiation. Background radiation exposure can come from two sources: cosmic origins; and terrestrials origins. The latter, also called gamma rays, is the more important. Additionally, deliberate exposure of unprocessed silver halide film to X-rays can occur at airports (individual inspections) or at border crossings (individual inspections and whole truck inspections). These background radiation exposures and X-ray exposures degrade the performance of the film. Referring to FIG. 2, a radiation indicator 60 is attached to the removable environmental sensitive label 90 to provide the consumer with a third signal to help assure film quality. The radiation indicator 60 would show the cumulative exposure to background radiation and would be used in conjunction with the cumulative time-temperature indicator 30 and the thermal event indicator 40. Such radiation indicators are available that change color on exposure (NAMSA Corporation) or vary in density (Harwell Dosimeters). These products typically are sensitive to high dosages of radiation exposure. Preferably, materials would be used that are sensitive to lower dosages of radiation exposure.

In a preferred embodiment of the invention, an environmental sensitive label 90 integrates the cumulative time-temperature indicator 30 and the radiation indicator 60 in a select material. For example, such a material could be silver halide itself. The cumulative time-temperature indicator 30 based on a photothermographic process such as suggested in previously referenced U.S. Pat. No. 6,113,857, U.S. Pat. No. 6,103,351, U.S. Pat. No. 6,043,021; and U.S. Pat. No. 5,940,637. The cumulative nature of both time-temperature and time-radiation exposure could be integrated into one element if the silver halide material is correctly designed. For example, the art teaches that larger grain emulsions are more sensitive to background radiation exposures than smaller grain emulsions. The art also teaches that emulsions with low aspect ratios are more sensitive to background radiation than emulsions with high aspect ratios. Therefore, the silver halide grain for such an integrated element could be tuned to match the degradation pathways associated with the film itself. For example, a large grain emulsion with low aspect ratio may be appropriate for high-speed films. FIG. 7 shows a bull's eye cumulative time-temperature indicator 131 and a bull's eye radiation indicator 60. If the cumulative time-temperature indicator 131 and the radiation indicator 60 can be the same material, as suggested by the use of a silver halide-based system, then only one indicator is required. Alternatively, separate photothermographic indicators could be used with one more sensitive to the radiation exposures while one is more sensitive to cumulative time-temperature exposure. Emulsions could thus be picked to favor use as a thermal sensor or use as a radiation sensor. Care is required to manage the construction of any silver halide material to have a low sensitivity to light fogging.

These aforementioned three types of indicators can be affixed to environmental sensitive label 90 (FIG. 2) that is attached to the outer container of a silver halide film package (not shown). As noted above, preferably indicators 30, 40, and 60 would be used on an environmental sensitive label 90 that can be removed from such an outer container and applied to the camera when the film is loaded into the camera as described in U.S. Pat. No. 6,043,021 and illustrated by text box 57 in FIG. 6. In so doing, the consumer can keep track of the film while the film is used in the camera. Indicators 30, 40, and 60 provide a means to alert the consumer that the film is nearing the end of its peak performance or has been exposed to excessive temperatures or radiation even when the film is loaded in a camera. The consumer can then take corrective actions including getting the exposed roll of film quickly to a photoprocessing lab for processing.

Figure 1:
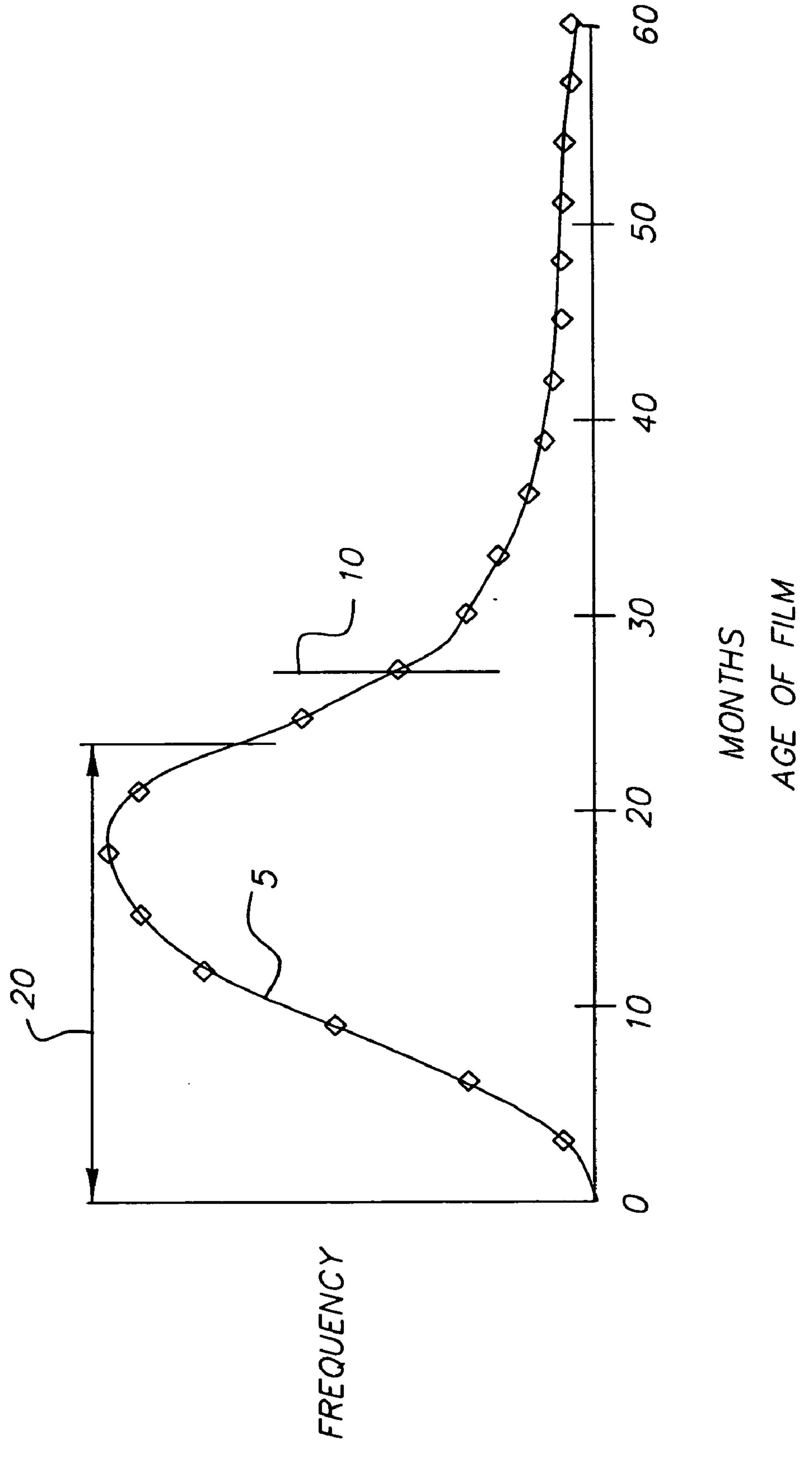
FIG. 1 is an illustration of an age distribution curve for film received by a photofinisher for processing and illustrates the uncontrolled consumer inventory problem.

Referring again to FIG. 2, indicators 30, 40, and 60 proposed herein are designed to aid the consumer in product handling. These indicators 30, 40, 60 also, by design, indicate an end-point when the product should be used. According to FIG. 1, the typical process in the trade is to use expiration dating 10. Expiration dating 10 is itself an end-point indicator. Using indicators 30, 40, and 60 and expiration dating 10 together creates a confusing message by posing the question "which is the important one to follow?" Given that the indicators 30, 40, and 60 are preferred because they reflect actual handling, these are the preferred terminus indicators. Therefore, expiration dating 10 should be dropped when indicators 30, 40, and 60 are used.

Terminus indicators described above identify the useable end point for the film or film loaded in a camera as a function of consumer usage. It would be desirable to increase the average rate at which the film is used by encouraging the consumer to use the film while it is fresher. In so doing, long-term storage is less likely to occur and the film is used closer to its performance capability 20, illustrated in FIG. 1. It is possible to change consumer behavior to use the film faster by making the consumer directly aware of the film's freshness. Freshness date indicator or date of birth (DOB) 80 in FIG. 2 indicates when the product was manufactured rather than when it expires. Freshness date indicator 80 can be used together with indicators 30, 40, and 60 to describe the product's usefulness to the consumer. Freshness date indicator 80 would specify the date the product was made and thus communicate to the consumer the exact age of the product. For example, assume that the product was created at time T and the expiration date was in T+2 years. Now assume the consumer uses the product at T+3 years. To the consumer reading the expiration date, the product is only one year past expiration. However, if the freshness date was used, the consumer now recognizes that the product is three years old. For many perishable materials this would be considered a long time. Thus, freshness date indicator 80 conveys a different consumer message than expiration dating. This, by itself, could lead to faster consumer utilization of the product during the product's peak capability, region 20 of the film age distribution curve 5 in FIG. 8, and could reduce the number of rolls of film that are in the "passed expiration" area of region 120, that is in the area beyond the expiration dating 10. Preferably, freshness date indicator 80 would be included on the removable environmental sensitive label 90 so that the information is available for the film that is used in the camera. Additionally, the removable environmental sensitive label 90 could include the product name and the ISO speed 70 in FIG. 2, thus providing two other bits of valuable information for the consumer that is presented on one transferable environmental sensitive label 90. Other useful information, such as the number of exposures on the roll of film, could also be included.

Current marketplace behavior indicates that consumers continue to use film after its expiration date. One of the motivators for such extended use is that consumers prefer to process a completely exposed roll of film. Therefore, freshness date indicator 80 may help make consumers aware of how old the product is and thus encourage them to consume the stored rolls of unused film. However, it is likely that the consumers will want to use these rolls of unexposed film in their cameras rather than simply discard them. This behavior may be driven by the sense of money lost if only a partially exposed roll of film is processed. To change this consumer perception of money lost and to encourage more rapid use of the exposed film, thus avoiding degradation of the film and/or the recorded images, a partial credit can be given to the consumer for the unexposed frames on the roll of film after the film is processed (see U.S. patent application Ser. No. 09/533,212, filed Mar. 23, 2000 by Dale F. McIntyre, titled "Method of Providing Photofinishing Credit;" EP 11/46457 filed Mar. 12, 2001 by Dale F. McIntyre, titled "Method Of Providing Photofinishing Credit;" and U.S. patent application Ser. No. 09/766,917, Filed Jan. 22, 2001 by David E. Fenton et al. titled "A Method of Providing Photographic Products and Services). Such a credit for unused exposures reduces the sense of loss thereby increasing the rate at which pictures are taken and film is processed thus reducing the number of very old rolls of film in use (see 120 of FIG. 8).

Referring again to FIG. 2, the indicators 30, 40, and 60 and the freshness date indicator 80 together in combination with partial credit provide a method that can increase the rate at which product held by the consumer is used so that the product is used nearer its peak performance. The combination of these methods can assist the consumer in more knowledgeable use of the silver halide based product, particularly encouraging the consumer to reduce the storage time of the product in an uncontrolled environment.

The invention has been described with reference to a preferred embodiment. However, it will be appreciated that variations and modifications can be effected by a person of ordinary skill in the art without departing from the scope of the invention.

PARTS LIST

5 film age distribution curve
10 expiration dating
20 film peak capability

30 cumulative time-temperature indicator
35 calibration ruler
40 thermal event indicator
45 temperature indicators
50 instruction set
55 optional instruction set
57 text box
60 radiation indicator
70 ISO speed
80 freshness date indicator (DOB)
90 environmental sensitive label
100 prime performance of film
131 bull's eye cumulative time-temperature indicator
132 annular ring
135 indicia
136 indicia
137 indicia
138 indicia
139 indicia
140 inner circle
141 single annular ring

What is claimed is:

1. An article of manufacture having an environmental sensitive label associated therewith, said environmental sensitive label comprising at least one irreversible cumulative time-temperature indicator that integrates a time-temperature profile of the article under expected ambient storage conditions and at least one irreversible thermal event indicator that indicates when the article has been exposed to very high temperatures that exceed the thermal limits of the article, and wherein said at least one irreversible cumulative time-temperature indicator and said at least one irreversible thermal event indicator each provides an independent verification of product performance in a predetermined environment.

2. The article of manufacture recited in claim 1 wherein said environmental sensitive label further comprises at least one radiation indicator affixed thereto and arranged among said at least one irreversible thermal event indicator and said at least one irreversible cumulative time-temperature indicator.

3. The article of manufacture recited in claim 1 wherein said environmental sensitive label further comprises a freshness date indicator.

4. The article of manufacture recited in claim 1 wherein said environmental sensitive label is removably affixed to an exterior portion of packaging enclosing said article of manufacture.

5. The article of manufacture recited in claim 1 wherein said environmental sensitive label is removably attached to said article of manufacture.

6. The article of manufacture recited in claim 1 further comprising a set of instructions advising the user how to interpret said at least one irreversible cumulative time-temperature indicator and said at least one irreversible thermal event indicator.

7. The article of manufacture recited in claim 1 wherein said at least one irreversible cumulative time-temperature indicator is configured to integrate time and temperature in said predetermined environment.

8. The article of manufacture recited in claim 2 wherein said at least one irreversible cumulative time-temperature indicator and said at least one irreversible radiation indicator each is a bull's eye indicator.

9. The article of manufacture recited in claim 2 wherein said at least one irreversible cumulative time-temperature indicator and said at least one irreversible radiation indicator each is a calibration ruler.

10. The article of manufacture recited in claim 1 wherein said at least one irreversible cumulative time-temperature indicator is a calibration ruler.

11. A photosensitive film product having an environmental sensitive label associated therewith, said environmental sensitive label comprising at least one irreversible cumulative time-temperature indicator that integrates a time-temperature profile of the product under expected ambient storage conditions and at least one irreversible thermal event indicator that indicates when the product has been exposed to very high temperatures that exceed the thermal limits of the product, and wherein said at least one irreversible cumulative time-temperature indicator and said at least one irreversible thermal event indicator each provides an independent verification of product performance in a predetermined environment.

12. The photosensitive film product recited in claim 11 wherein said environmental sensitive label further comprises at least one radiation indicator affixed thereto and arranged among said at least one irreversible thermal event indicator and said at least one irreversible cumulative time-temperature indicator.

13. The photosensitive film product recited in claim 11 wherein said environmental sensitive label further comprises a freshness date indicator.

14. The photosensitive film product recited in claim 11 wherein said environmental sensitive label is removably affixed to an exterior portion of packaging enclosing said photosensitive film product.

15. The photosensitive film product recited in claim 11 wherein said environmental sensitive label is removably attached to said photosensitive film product.

16. The photosensitive film product recited in claim 11 further comprising a set of instructions advising a user how to interpret said at least one irreversible cumulative time-temperature indicator and at least one irreversible thermal event indicator.

17. The photosensitive film product recited in claim 11 wherein said irreversible cumulative time-temperature indicator is configured to integrate time and temperature in said predetermined environment.

18. The photosensitive film product recited in claim 12 wherein said at least one irreversible cumulative time-temperature indicator and said at least one radiation indicator each is a bull's eye indicator.

19. The photosensitive film product recited in claim 12 wherein said at least one irreversible cumulative time-temperature indicator and said at least one irreversible radiation indicator each is a calibration ruler.

20. The photosensitive film product recited in claim 11 wherein said at least one irreversible cumulative time-temperature indicator is a calibration ruler.

* * * * *